US010991852B2

(12) United States Patent
Lee et al.

(10) Patent No.: US 10,991,852 B2
(45) Date of Patent: Apr. 27, 2021

(54) TRANSPARENT LIGHT-EMITTING DISPLAY FILM, METHOD OF MANUFACTURING THE SAME, AND TRANSPARENT LIGHT-EMITTING SIGNAGE USING THE SAME

(71) Applicants: Jmicro Inc., Daejeon (KR); Korea Advanced Institute of Science and Technology (KAIST), Daejeon (KR)

(72) Inventors: Seung Seob Lee, Daejeon (KR); Dong Jin Kim, Daejeon (KR); Munhyung Jo, Daejeon (KR); Jung-woo Lee, Daejeon (KR)

(73) Assignees: JMICRO INC., Daejeon (KR); KOREA ADVANCED INSTITUTE OF SCIENCE AND TECHNOLOGY (KAIST), Daejeon (KR)

( * ) Notice: Subject to any disclaimer, the term of this patent is extended or adjusted under 35 U.S.C. 154(b) by 0 days.

(21) Appl. No.: 16/522,165

(22) Filed: Jul. 25, 2019

(65) Prior Publication Data

US 2020/0035866 A1  Jan. 30, 2020

Related U.S. Application Data

(60) Provisional application No. 62/713,319, filed on Aug. 1, 2018.

(30) Foreign Application Priority Data

Jul. 25, 2018 (KR) .................. 10-2018-0086702
Jul. 12, 2019 (KR) .................. 10-2019-0084682

(51) Int. Cl.
*H01L 33/42* (2010.01)
*G09G 3/32* (2016.01)
(Continued)

(52) U.S. Cl.
CPC .............. *H01L 33/42* (2013.01); *G09G 3/32* (2013.01); *H01L 33/44* (2013.01);
(Continued)

(58) Field of Classification Search
CPC ...... H01L 33/42; H01L 51/5234; H01L 33/44; H01L 2251/308; G09G 3/32
See application file for complete search history.

(56) References Cited

U.S. PATENT DOCUMENTS 4,074,299 A * 2/1978 Kusano ................... H01L 33/62
257/93
10,429,892 B1 * 10/2019 Mathew ............... H05K 5/0017
(Continued)

FOREIGN PATENT DOCUMENTS

JP   2001177118 A  *  6/2001
JP   2009-239236 A    10/2009
(Continued)

OTHER PUBLICATIONS

KR 2013-77059 (machine translated document) (Year: 2013).*
(Continued)

*Primary Examiner* — Ahmed N Sefer
(74) *Attorney, Agent, or Firm* — Hauptman Ham, LLP

(57) ABSTRACT

A transparent light-emitting display film includes a transparent substrate in a form of film, a transparent electrode on a first side of the transparent substrate, a through hole formed to penetrate the transparent substrate in a direction perpendicular to a plane of the transparent substrate, a light-emitting device mounted in the through hole, and a connection member configured to electrically connect the transparent electrode and the light-emitting device.

15 Claims, 8 Drawing Sheets

(51) Int. Cl.
   *H01L 51/52*   (2006.01)
   *H01L 33/44*   (2010.01)
   H01L 25/075   (2006.01)
   H01L 33/58   (2010.01)
   H01L 33/38   (2010.01)
   H01L 33/62   (2010.01)
   H01L 27/15   (2006.01)
   H01L 33/20   (2010.01)

(52) U.S. Cl.
   CPC ...... *H01L 51/5234* (2013.01); *H01L 25/0753* (2013.01); *H01L 27/156* (2013.01); *H01L 33/20* (2013.01); *H01L 33/385* (2013.01); *H01L 33/58* (2013.01); *H01L 33/62* (2013.01); *H01L 2251/308* (2013.01)

(56) References Cited

U.S. PATENT DOCUMENTS

| | | | | |
|---|---|---|---|---|
| 2003/0025446 | A1* | 2/2003 | Lin | H01J 1/74 313/504 |
| 2005/0285521 | A1* | 12/2005 | Menda | H01L 51/5253 313/512 |
| 2008/0297453 | A1* | 12/2008 | Ray | H01L 27/3281 345/82 |
| 2013/0236997 | A1* | 9/2013 | Lee | H01L 33/48 438/27 |
| 2014/0373898 | A1* | 12/2014 | Rogers | H01L 27/124 136/246 |
| 2015/0155441 | A1* | 6/2015 | Alexeev | H01L 33/483 257/99 |
| 2015/0207050 | A1* | 7/2015 | Tsukada | H01L 24/82 257/784 |
| 2016/0056134 | A1* | 2/2016 | Hsieh | F21K 9/232 257/89 |
| 2018/0254399 | A1* | 9/2018 | Derix | G02B 6/0023 |

FOREIGN PATENT DOCUMENTS

| | | | |
|---|---|---|---|
| JP | 2015-191540 | A | 11/2015 |
| KR | 2013077059 | * | 7/2013 |
| KR | 10-1789145 | B1 | 10/2017 |
| KR | 10-1847100 | B1 | 4/2018 |
| KR | 10-2018-0047760 | A | 5/2018 |

OTHER PUBLICATIONS

JP 2001-177118 (machine translated document) (Year: 2001).*
Japanese Office Action dated Aug. 20, 2019, in connection with the Japanese Patent Application No. 2019-136026.

* cited by examiner

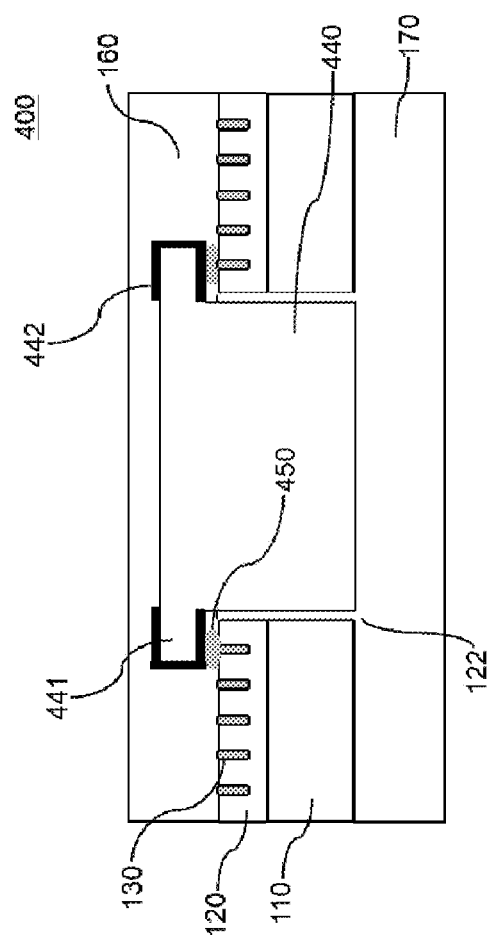

TRANSPARENT LIGHT-EMITTING DISPLAY FILM, METHOD OF MANUFACTURING THE SAME, AND TRANSPARENT LIGHT-EMITTING SIGNAGE USING THE SAME

CROSS-REFERENCE TO RELATED APPLICATIONS

This application is based upon and claims the benefit of priority from Korean Patent Application No. 10-2019-0084682, filed Jul. 12, 2019, US Patent Application No. 62/713,319, filed Aug. 1, 2018, Korean Patent Application No. 10-2018-0086702, filed Jul. 25, 2018, the contents of which are incorporated herein by reference in their entirety.

BACKGROUND

1. Field

The present invention relates to a transparent light-emitting display film, a method of manufacturing the same, and a transparent light-emitting signage employing the same.

2. Description of the Related Art

A light-emitting display is a device that provides visual information to a user by using an electronic circuit and a light-emitting device. A typical light-emitting display includes a light-emitting diode (LED) mounted on an opaque printed circuit board (PCB); however, a transparent light-emitting display device for securing the visibility of the display itself is being developed (see, for example, Korean Patent Application Publication Laid-Open No. 10-2018-0047760, Korean Patent Publication No. 10-1847100, and Korean Patent Publication No. 10-1789145).

The transparent light-emitting display can be applied to an LED signage to make the signage itself thinner. For this purpose, there is a need for a structure capable of stably supporting electronic devices mounted on the display, including an LED device, against possible warping or bending of the LED signage.

SUMMARY

According to some embodiments of the present invention, a transparent light-emitting display film includes a transparent substrate in a form of film, a transparent electrode on a first side of the transparent substrate, a through hole formed to penetrate the transparent substrate in a direction perpendicular to a plane of the transparent substrate, a light-emitting device mounted in the through hole, and a connection member configured to electrically connect the transparent electrode and the light-emitting device.

According to some embodiments of the present invention, a method of manufacturing a transparent light-emitting display film includes applying a resin layer to a first side of a transparent substrate electrode in a film-like form, forming an electrode pattern groove on the resin layer, forming a transparent electrode in the electrode pattern groove, forming a through hole in the transparent substrate on which the transparent electrode is formed, to penetrate the transparent substrate and the resin layer in a direction perpendicular to a plane of the transparent substrate at a position for mounting a light-emitting device, inserting the light-emitting device into the through hole, and connecting electrically the transparent electrode and the light-emitting device.

According to some embodiments of the present invention, a transparent light-emitting signage includes a transparent light-emitting display film including a transparent substrate in a form of film, a transparent electrode on a first side of the transparent substrate, a through hole formed to penetrate the transparent substrate in a direction perpendicular to a plane of the transparent substrate, a light-emitting device mounted in the through hole, and a connection member configured to electrically connect the transparent electrode and the light-emitting device.

The above and other objects, features, advantages and technical and industrial significance of this invention will be better understood by reading the following detailed description of presently preferred embodiments of the invention, when considered in connection with the accompanying drawings.

BRIEF DESCRIPTION OF THE DRAWINGS

FIG. 4 is a cross-sectional view of a transparent light-emitting display film employing a wing-type (T-type) LED chip according to some embodiments of the present invention;

DETAILED DESCRIPTION OF THE PREFERRED EMBODIMENTS

Exemplary embodiments of the present invention are described in detail below with reference to the accompanying drawings.

It is one object of the present invention to provide a transparent light-emitting display film in which light-emitting devices are embedded inside of a substrate to minimize protrusion, preventing detachment of junctions of light-emitting devices and other mounted electronic devices due to the display substrate being warped or else receiving external contact force, to securely hold the mounted electronic devices on the final display.

It is another object of the present invention to provide a method of manufacturing a transparent light-emitting display film in which light-emitting devices are embedded inside of a substrate to minimize protrusion, preventing detachment of junctions of light-emitting devices and other mounted electronic devices due to the display substrate being warped or else receiving external contact force, to securely hold the mounted electronic devices on the final display.

It is still another object of the present invention to provide a transparent light-emitting signage in which light-emitting devices are embedded inside of a substrate to minimize protrusion, preventing detachment of junctions of light-emitting devices and other mounted electronic devices due to the display substrate being warped or else receiving external contact force, to securely hold the mounted electronic devices on the final display.

The technical problems to be solved by the present disclosure are not limited to the above-mentioned, and other technical problems not mentioned herein can be clearly understood by one of ordinary skill in the pertinent art from the following descriptions.

Figure 1:
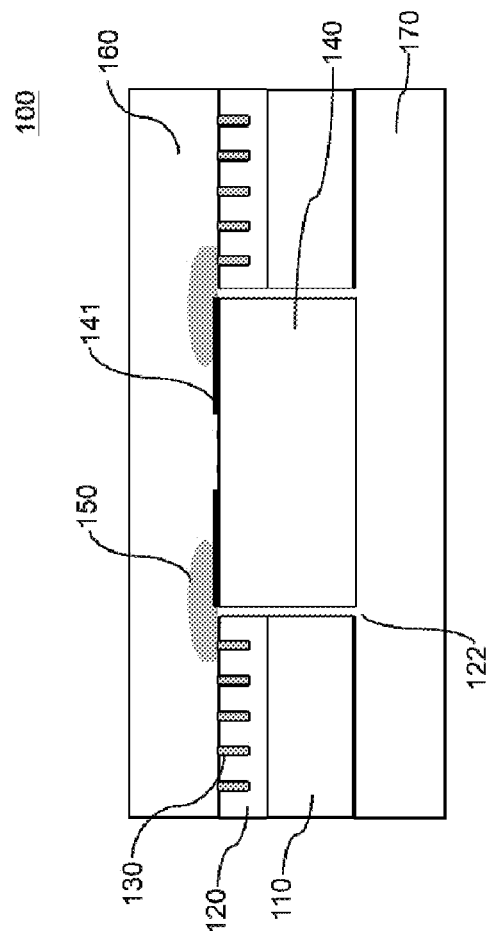
FIG. 1 is a cross-sectional view of a transparent light-emitting display film according to some embodiments of the present invention.

FIG. 1 is a cross-sectional view of a transparent light-emitting display film 100 according to some embodiments of the present invention.

As shown in FIG. 1, the transparent light-emitting display film 100 according to some embodiments of the present invention includes a transparent substrate 110 in the form of a film, transparent electrodes 130 formed on the transparent substrate 110, a through hole 122 formed to penetrate the transparent substrate 110 in a direction perpendicular to the plane (surface) of the transparent substrate 110, a light-emitting device 140 mounted in the through hole 122, and an electrode connection 150 for electrically interconnecting the transparent electrode 130 and the light-emitting device 140.

FIG. 1 illustrates one light-emitting device 140 as an example, but in practice the transparent light-emitting display film 100 according to some embodiments of the present invention is formed as a display from an array of multiples of the same structure as that shown in FIG. 1.

In the example shown in FIG. 1, the upper side of the drawing is defined as the upper side of the transparent substrate 110, but this is a relative orientation as viewed from the standpoint of the manufacturing process. In case where a device is depicted to emit light to the lower side by the drawing, the illustrated lower side may define the upper side of the transparent substrate 110. Thus, the upper or lower side described herein may represent the opposite depending on the reference direction.

In at least one embodiment of the present invention, the transparent substrate 110 is a transparent polymer substrate (film of PET, PC, PCT, PEN, PU, TPU, PI, or silicone rubber).

In at least one embodiment of the present invention, the thickness of the transparent substrate 110 is equal to or less than the height of the light-emitting device 140, although it may depend on the height of the light emitting device 140 to be equal to or greater than the same height.

Specifically, in at least one embodiment of the present invention, the thickness of the transparent substrate 110 is 0.3 mm or less. In some embodiments of the present invention, the thickness of the transparent substrate 110 is 0.25 mm or less. In another embodiment of the present invention, the thickness of the transparent substrate 110 is 0.188 mm or less.

The transparent electrodes 130 may be provided by forming a resin layer 120 on the transparent substrate 110, and forming electrode pattern grooves 121 in the resin layer 120, and then filling the electrode pattern grooves 121 with an ink composed of, for example, Au, Ag, Cu, CNT, an Ag nanowire, or a combination thereof.

The transparent electrodes 130 includes a transparent electrode of a metal oxide in a thin film form including ITO, IZO, IZTO, or ZnO, a transparent electrode in a nanomaterial coating form of a two-dimensional or three-dimensional structure including CNT, silver nanowire, silver nanofiber, or graphene, a transparent electrode in a metal mesh form having a nano-linewidth or a micro-linewidth of a metal including gold, silver, copper, or an alloy thereof, or a combination thereof.

The electrode connection 150 is formed by a soldering process or a screen printing process or dispensing of a conductive ink or paste to electrically connect a light-emitting device electrode 141 of the light-emitting device 140 with the transparent electrode 130.

In at least one embodiment of the present invention, the transparent light-emitting display film 100 further includes a first protection layer 160 formed over the transparent substrate 110 and covering over the transparent substrate 110, the transparent electrodes 130 and the upper portion of the light-emitting device 140, and includes a second protection layer 170 formed under the transparent substrate 110 and covering the lower portion of the transparent substrate 110 and the lower portion of the light-emitting device 140.

As described above, the transparent light-emitting display film may be made to have the total display film thickness of 1 mm or less by using the transparent substrate 110 having a thickness equal to or less than the height of the light-emitting device 140, forming the through hole 122 in the transparent substrate 110, inserting the light-emitting device 140 in the through hole 122, and thereby binding the light-emitting device 140 and the transparent substrate 110 together.

In at least one embodiment of the present invention, the transparent light-emitting display film may be made to have the total display film thickness of 0.5 mm or less by using the transparent substrate 110 having a thickness equal to or less than the height of the light-emitting device 140, forming the through hole 122 in the transparent substrate 110, inserting the light-emitting device 140 in the through hole 122, and thereby binding the light-emitting device 140 and the transparent substrate 110 together.

When a transparent LED signage is produced with such a transparent light-emitting display film, for example, it can adhere to a curved surface since it has a property of flexing capacity. Further, since the transparent light-emitting display film LED signage is formed of a plastic material and is light with its transparency, it may not obscure the visual field even when attached to a window.

In at least one embodiment of the present invention, a lens section or a scattering section may be formed at a portion of the transparent light-emitting display film where light is emitted in order to scatter light emitted from the light-emitting device 140, adjust the focus, or make parallel light to enhance visibility.

Figure 2A:
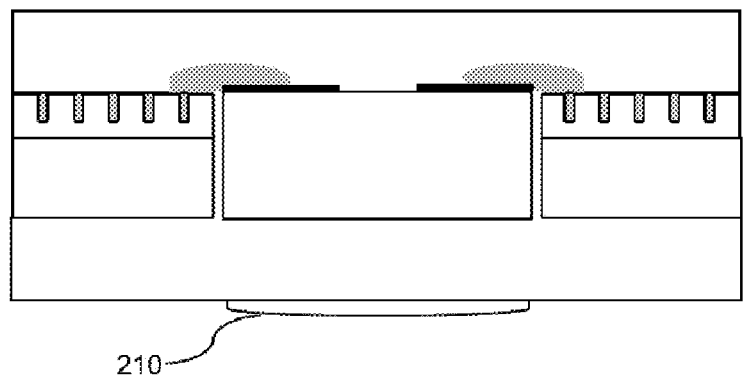
FIGS. 2A and 2B are cross-sectional views of transparent light-emitting display films (with and without lens mounted) according to some embodiments of the present invention.
Figure 2B:
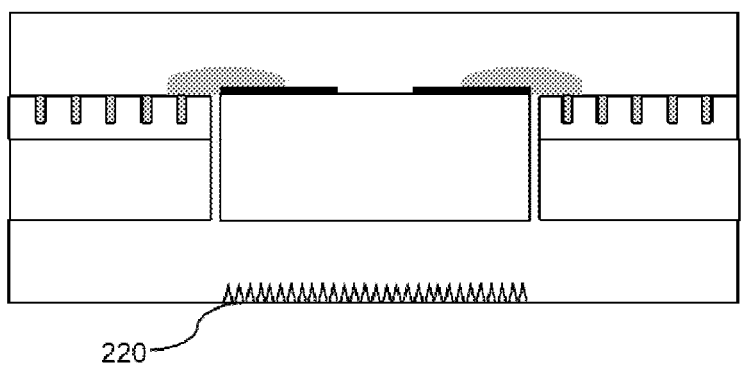

FIGS. 2A and 2B are cross-sectional views of transparent light-emitting display films 200, 200' according to some embodiments of the present invention.

As shown in FIGS. 2A and 2B, the transparent light-emitting display films 200 and 200' further include a lens section 210 and a scattering section 220, respectively at portions thereof where light is emitted. FIGS. 2A and 2B show exemplary structures in which light is emitted downward in the drawings. Unlike those of FIGS. 2A and 2B, in a structure where light is emitted upward, the lens section 210 or the scattering section 220 may be provided on the upper side of the transparent light-emitting display films.

The lens section 210 is formed with a lens having a specific shape in a portion of the protection layer from which light is emitted from the light-emitting device, among other portions of the transparent light-emitting display film.

In at least one embodiment of the present invention, the lens section 210 may include a spherical or aspherical micro-lens shape for refracting at least a portion of the light generated from the light-emitting device.

The scattering section 220 may include a grid pattern of irregularities for scattering, dispersing, or diffracting at least a part of the light generated from the light-emitting device.

For example, the lens section 210, as with the scattering section 220, may be formed during the application of the UV or thermosetting resin in the step of forming the protection layer on the transparent substrate, by imprinting a lens in the protection layer by using a mold of a specific shape, into a lens section having a desired shape in the protection layer.

Alternatively, the lens section 210, as with the scattering section 220, may be formed after forming the protection layer, by applying additional resin and performing a forming process such as imprinting, etching or engraving, into a lens section having a desired shape in the protection layer. For example, in case where the shape of the lens section includes an engraved or concave shape, the lens section may be formed by recessing and forming depressed or recessed grooves in the protection layer at the corresponding portion without application of additional resin.

FIGS. 3A to 3I are conceptual diagrams illustrating the steps of manufacturing a transparent light-emitting display film according to some embodiments of the present invention.

As shown in FIGS. 3A to 3I, a method of manufacturing a transparent light-emitting display film according to some embodiments of the present invention includes mounting electronic devices including a light-emitting device such as an LED chip or a resistor on a filmlike transparent substrate.

The transparent light-emitting display film by the manufacturing method according to some embodiments of the present invention has a property of being flexible and can be attached to a curved surface. Further, with its light and transparent plastic material, the transparent light-emitting display film will not obscure the visual field even when attached to a window.

A method of manufacturing a transparent light-emitting display film according to some embodiments of the present invention includes the steps of: applying a resin layer to one side of a transparent substrate that is in a film-like form, forming an electrode pattern groove in the resin layer, forming a transparent electrode (e.g., a metal mesh electrode) in the electrode pattern groove, forming a through hole in the transparent substrate formed with the transparent electrode to penetrate the transparent substrate and the resin layer in a direction perpendicular to a plane (surface) of the transparent substrate at a position to mount a light-emitting device, inserting the light-emitting device into the through hole, and electrically connecting the transparent electrode with the light-emitting device.

Figure 3A:
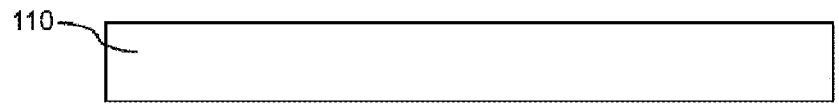
FIGS. 3A to 3I are conceptual diagrams illustrating the steps of manufacturing a transparent light-emitting display film according to some embodiments of the present invention.

A transparent polymer substrate 110 (film of PET, PC, PCT, PEN, PU, TPU, PI, or silicone based rubber or the like) is prepared having a thickness thinner than or similar to that of the light-emitting device, as shown in FIG. 3A. In this case, the thinner the transparent polymer substrate 110, the higher the transparency, the easier the processing, and the more flexible the product. Thus, in at least one embodiment of the present invention, the thickness of the light-emitting device may be thicker than the film thickness. The transparent polymer substrate 110 is an example of a transparent substrate.

For example, a light-emitting diode (LED) is used as the light-emitting device. In this embodiment, the LED is used as the light-emitting device. although any device can be used as long as it is a device of chip unit that converts electricity into light, such as a laser diode (LD) or an organic light-emitting diode (OLED).

Figure 3B:
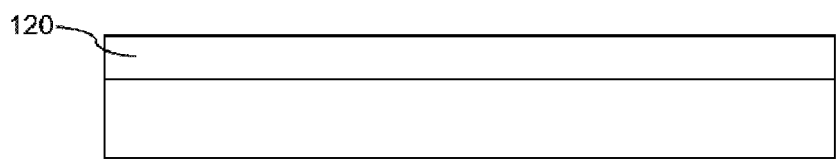

As shown in FIG. 3B, the resin layer 120 is applied to form a transparent electrode on the transparent substrate. For example, a UV embossing process may be performed using a UV resin for forming a fine pattern of grooves. Alternatively, a thermal imprinting process may be performed by using a thermosetting resin.

Figure 3C:
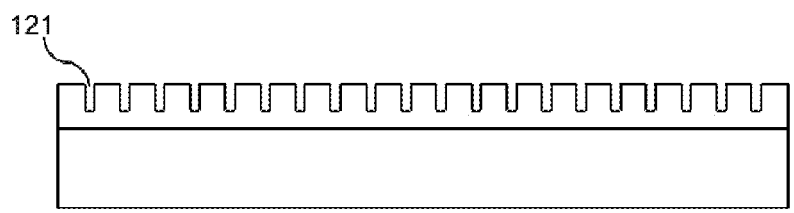

As shown in FIG. 3C, the electrode pattern grooves 121 are formed in the resin layer formed on the transparent substrate.

As a method of forming the electrode pattern on the substrate, imprinting, coating, deposition and etching, or photolithography may be used.

Figure 3D:
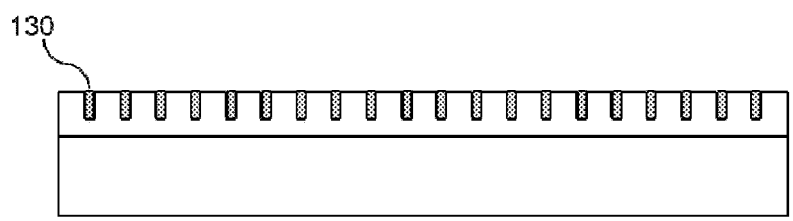

As shown in FIG. 3D, a pattern of metal mesh electrodes 130 is formed by filling the electrode pattern grooves with conductive ink or paste through a doctoring process performed, for example, by scraping the surface with a blade.

For example, a method of forming an electrode pattern may be an inkjet method, offset printing, reverse offset printing, flat screen printing, spin coating, roll coating, flow coating, dispensing, gravure printing, or flexography.

Figure 3E:

As shown in FIG. 3E, the through hole 122 is formed at a size slightly larger than the size of the light-emitting device at the position where the light-emitting device is mounted. For example, the through hole may be drilled using a method such as a punching process, laser processing, or general machining.

Figure 3F:
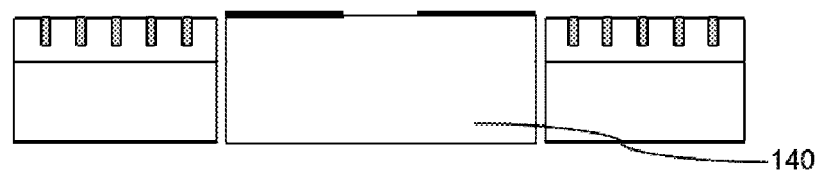

As shown in FIG. 3F, a light-emitting device 140 is mounted in the through hole formed in the transparent substrate.

Figure 3G:
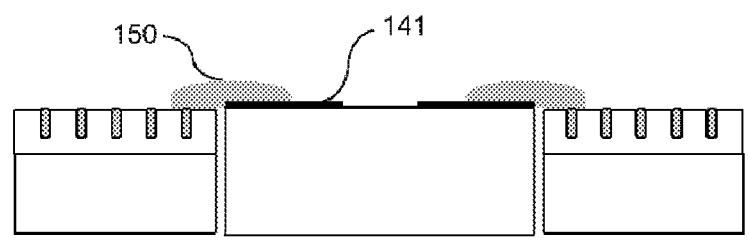

As shown in FIG. 3G, the electrode connection 150 is formed by a soldering process or a screen printing or a dispensing process with a conductive ink or paste, so that the electrodes of the light-emitting device chip and the transparent electrode are electrically interconnected. Electrically-connected solder or conductive paste has good properties when they are the kinds of being cured and soldered at high temperature, but temperature and curing time are selected to save the plastic substrate from its susceptibility to severe thermal deformation (for example, relatively low temperature or short curing time for common PET, PC or such films, and relatively high temperature or long curing time for PI or such film for use with high-temperature materials).

Figure 3H:
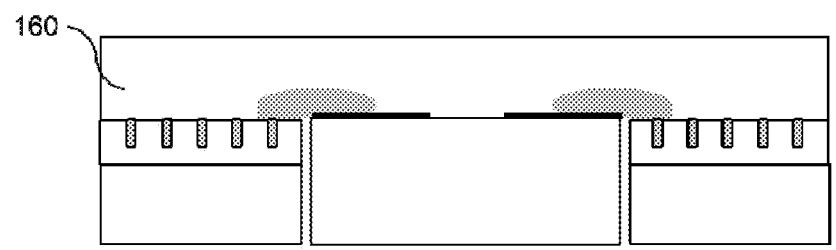

As shown in FIG. 3H, a UV or thermosetting resin may be applied to the entire surface of the transparent substrate on which the light-emitting device chip 140 is exposed, and it may be cured using UV or heat to form the first protection layer 160. Thereafter, a transparent film may be selectively disposed thereon to protect the surface where the transparent electrode is connected with the electrode of the light-emitting device chip.

At this time, using transparent film having no adhesion with UV resin allows UV resin to be used alone for protecting the relevant surface. In that case, the UV resin enters the gap between the substrate and the light-emitting device chip to fill the void, so that the light-emitting device chip can be more strongly supported on the transparent substrate.

Figure 3I:
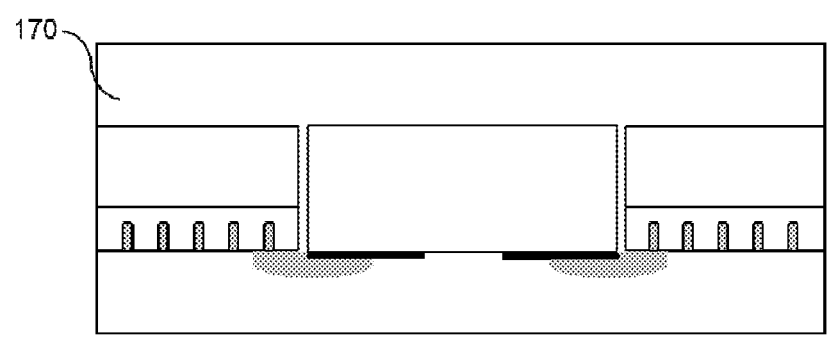

As shown in FIG. 3I, UV resin is applied to the transparent substrate's side opposite to its side where the light-emitting device chip is exposed. The second protection layer 170 then may be formed by selectively covering a transparent film protectively over the relevant surface.

At this time, using transparent film having no adhesion with UV resin allows the UD resin alone to protect the relevant surface. In this case, the UV resin enters a gap between the substrate and the light-emitting device chip to fill the void, so that the light-emitting device chip can be supported more firmly.

Through the process as described above, the resin permeates tightly to the gap space on the upper side, lower side and inner side of the light-emitting device chip and can firmly support thereof, so that the light-emitting device chip can be stably fixed to the transparent substrate.

According to some embodiments of the present invention, a method of fabricating a transparent light-emitting display film further includes forming a lens section or a scattering section at a portion where light is emitted from the light-emitting device.

The step of forming the lens section may be a step of forming a lens section having a specific shape on a part of the protection layer from which light is emitted from the light-emitting device chip, among other parts of the transparent light-emitting display film.

For example, the lens section may include a spherical or aspherical micro-lens shape for refracting at least a portion of the light generated from the light-emitting device chip. For example, the lens section may include a grid pattern of irregularities for scattering, dispersing, or diffracting at least a part of the light generated from the light-emitting device chip. For example, the lens section may be formed to have any of various shapes depending on the purpose of use.

For example, the step of forming the lens section may include imprinting the protection layer on the protection layer by using a mold having a specific shape into a lens section having a desired shape in the protection layer during the process of applying the UV resin in the step of forming the protection layer on the entire surface of the transparent substrate.

Alternatively, the step of forming the lens section includes, after forming the protection layer, applying additional resin and performing a forming process such as imprinting, etching or engraving, into a lens section. For example, in case where the shape of the lens section includes an engraved or concave shape, the lens section may be formed by recessing and forming depressed or recessed grooves in the protection layer at the relevant portion without application of additional resin.

FIG. 4 is a cross-sectional view of a transparent light-emitting display film 400 employing a wing-type (T-type) LED chip according to some embodiments of the present invention The transparent light-emitting display film 400 shown in FIG. 4 includes a light-emitting device 440 instead of the light-emitting device 140 shown in FIG. 1.

The light-emitting device 440 is a wing-type LED with an upper part on both sides extending outward to form a T shape in the side view, including a wing 441 on each of the sides and a light-emitting device electrode 442 formed on the wing 441. The light is emitted in the upper or lower direction.

The transparent light-emitting display film 400 employing the light-emitting device 440 can allow the light-emitting device electrode 442 and the transparent electrode 130 to be electrically connected by using the electrode connection 150 shown in FIGS. 1 to 3I. Further, as shown in FIG. 4, the transparent light-emitting display film 400 can also allow the light-emitting device electrode 442 and the transparent electrode 130 to be electrically connected in a more efficient manner by using a electrode connection 450 between the light-emitting device electrode 442 and the transparent electrode 130 by way of a lower surface of the light-emitting device electrode 442 formed on each of the both side in a protruding manner.

Figure 5:
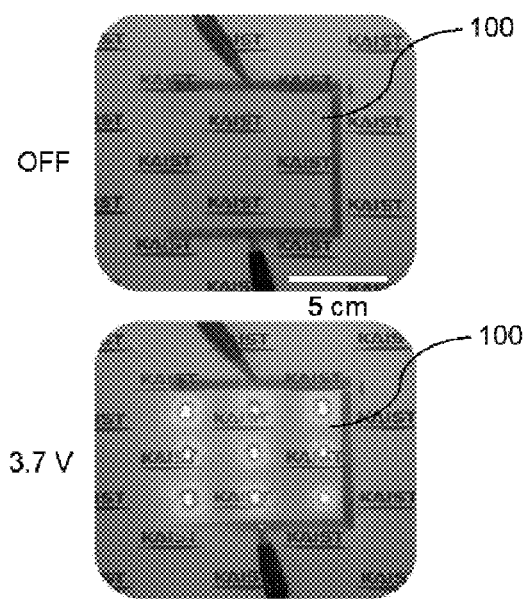
FIG. 5 is images showing an actual operation of a transparent light-emitting display film in which light-emitting devices are arranged in a 3×3 array.

FIG. 5 is images showing the actual operation of the transparent light-emitting display film 100 in which light-emitting devices are arranged in a 3×3 array.

The fabricated transparent light-emitting display film has a general thickness of about 0.5 mm. In the power off state (upper image of FIG. 4), the display film exhibits its transparency. When energized by the power source (3.7 V), the display film operates the LED devices to perform its display function (bottom image of FIG. 4).

Figure 6:
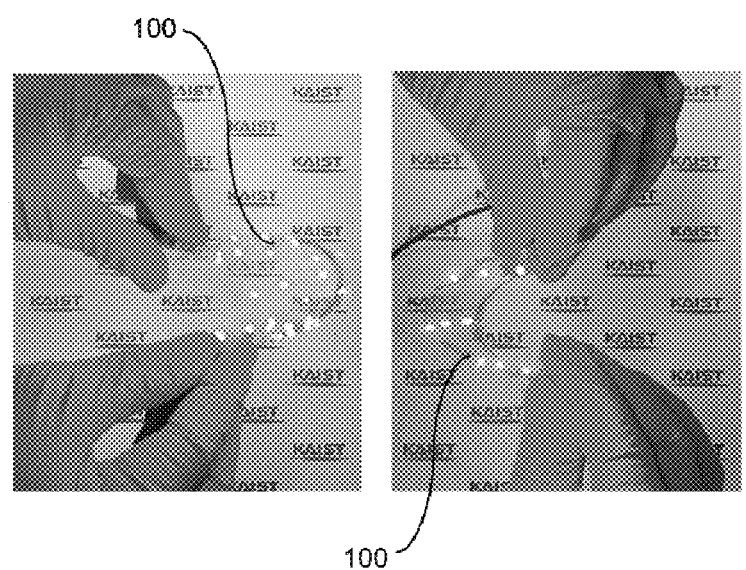
FIG. 6 is images demonstrating the flexibility of a transparent light-emitting display film actually produced.

FIG. 6 is images demonstrating the flexibility of the transparent light-emitting display film 100 actually produced.

When manufactured using the transparent substrate of 0.188 mm thickness into the general thickness of around 0.5 mm, the transparent light-emitting display film 100 can bend freely in both directions as shown in FIG. 5 and can be attached freely even to curved surfaces.

In addition, the formation of both top and bottom protection layers can stably support electronic devices mounted on the display, such as a light-emitting device or a resistor, even if the display substrate is warped.

When fabricated with the transparent light-emitting display film thus produced, a transparent light-emitting signage can be mounted on various surfaces including a curved surface to provide a desirable promoting effect without obstructing one's field of vision.

As described above, at least one embodiment of the present invention can provide a transparent light-emitting display film which can prevent detachment of junctions of light-emitting devices and other mounted electronic devices due to the display substrate being warped or else receiving external contact force, to securely hold the mounted electronic devices on the final display.

In addition, at least one embodiment of the present invention can provide a method of manufacturing a transparent light-emitting display film which can prevent detachment of junctions of light-emitting devices and other mounted electronic devices due to the display substrate being warped or else receiving external contact force, to securely hold the mounted electronic devices on the final display.

Further, at least one embodiment of the present invention can provide a transparent light-emitting signage which can prevent detachment of junctions of light-emitting devices and other mounted electronic devices due to the display substrate being warped or else receiving external contact force, to securely hold the mounted electronic devices on the final display.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A transparent light-emitting display film, comprising:
   A transparent substrate in a form of flexible film, the transparent substrate forming an electrode pattern groove on a first side of the transparent substrate;
   a transparent electrode on the first side of the transparent substrate, the transparent electrode formed in the electrode pattern groove and including a first transparent electrode and a second transparent electrode on the first side;

a through hole formed to penetrate through the transparent substrate in a direction perpendicular to the first side of the transparent substrate;

a light-emitting device including a first device electrode and a second device electrode on a first side thereof, the light-emitting device mounted in the through hole in a manner that the first side of the light-emitting device on which the first device electrode and the second device electrode are provided and the first side of the transparent substrate are substantially level;

a first connection member configured to electrically connect the first transparent electrode and the first device electrode of the light-emitting device; and a second connection member configured to electrically connect the second transparent electrode and the second device electrode of the light-emitting device.

2. The transparent light-emitting display film according to claim 1, wherein each of the first transparent electrode and the second transparent electrode includes a transparent electrode of a metal oxide in a thin film form including ITO, IZO, IZTO, or ZnO, a transparent electrode in a nanomaterial coating form of a two-dimensional or three-dimensional structure including CNT, silver nanowire, silver nanofiber, or graphene, a transparent electrode in a metal mesh form having a nano-linewidth or a micro-linewidth of a metal including gold, silver, copper, or an alloy thereof, or a combination thereof.

3. The transparent light-emitting display film according to claim 1, wherein the transparent substrate has a thickness equal to or smaller than 0.3 millimeters.

4. The transparent light-emitting display film according to claim 1, wherein the transparent substrate has a thickness equal to or smaller than 0.25 millimeters.

5. The transparent light-emitting display film according to claim 1, wherein the transparent substrate has a thickness equal to or smaller than 0.188 millimeters.

6. The transparent light-emitting display film according to claim 1, further comprising a first protection layer on the first side of the transparent substrate, covering the first side of the transparent substrate, the first transparent electrode, the second transparent electrode, and the first side of the light-emitting device.

7. The transparent light-emitting display film according to claim 6, further comprising a second protection layer on a second side of the transparent substrate opposite to the first side, covering the second side of the transparent substrate and a second side of the light-emitting device.

8. The transparent light-emitting display film according to claim 1, further comprising a lens section or a scattering section at an area where light from the light emitting device is emitted.

9. The transparent light-emitting display film according to claim 1, wherein a total thickness of the transparent light-emitting display film is equal to or smaller than 1 millimeter.

10. The transparent light-emitting display film according to claim 1, wherein a total thickness of the transparent light-emitting display film is equal to or smaller than 0.5 millimeters.

11. The transparent light-emitting display film according to claim 1, wherein the transparent substrate is a transparent polymer substrate including a film of any one of PET, PC, PCT, PEN, PU, TPU, PI, and silicone rubber.

12. The transparent light-emitting display film according to claim 1, wherein the transparent light-emitting display film is flexible and bendable.

13. A transparent light-emitting signage comprising a transparent light-emitting display film, the transparent light-emitting display film including a transparent substrate in a form of flexible film, the transparent substrate forming an electrode pattern groove on a first side of the transparent substrate;

a transparent electrode on the first side of the transparent substrate, the transparent electrode formed in the electrode pattern groove and including a first transparent electrode and a second transparent electrode on the first side;

a through hole formed to penetrate through the transparent substrate in a direction perpendicular to the first side of the transparent substrate;

a light-emitting device including a first device electrode and a second device electrode on a first side thereof, the light-emitting device mounted in the through hole in a manner that the first side of the light-emitting device on which the first device electrode and the second device electrode are provided and the first side of the transparent substrate are substantially level; and a first connection member configured to electrically connect the first transparent electrode and the first device electrode of the light-emitting device; and a second connection member configured to electrically connect the second transparent electrode and the second device electrode of the light-emitting device.

14. The transparent light-emitting display film according to claim 13, wherein the transparent substrate is a transparent polymer substrate including a film of any one of PET, PC, PCT, PEN, PU, TPU, PI, and silicone rubber.

15. The transparent light-emitting display film according to claim 13, wherein the transparent light-emitting display film is flexible and bendable.

* * * * *